United States Patent [19]

Yoda et al.

[11] Patent Number: 5,368,977
[45] Date of Patent: Nov. 29, 1994

[54] POSITIVE TYPE PHOTOSENSITIVE QUINONE DIAZIDE PHENOLIC RESIN COMPOSITION

[75] Inventors: Eiji Yoda; Hitoshi Yuasa; Yutaka Otsuki, all of Yokohama, Japan

[73] Assignee: Nippon Oil Co. Ltd., Tokyo, Japan

[21] Appl. No.: 34,357

[22] Filed: Mar. 19, 1993

[30] Foreign Application Priority Data

Mar. 23, 1992 [JP] Japan .................. 4-065327

[51] Int. Cl.$^5$ ............................ G03F 7/023
[52] U.S. Cl. .................... 430/190; 430/192; 430/193
[58] Field of Search ............ 430/190, 192, 193

[56] References Cited

U.S. PATENT DOCUMENTS 5,173,389 12/1992 Uenishi et al. .......... 430/190
5,178,986 1/1993 Zampini et al. .......... 430/190

Primary Examiner—Charles L. Bowers, Jr.
Assistant Examiner—Christopher G. Young
Attorney, Agent, or Firm—Darby & Darby

[57] ABSTRACT

A positive type photosensitive resin composition contains (a) a quinone diazido phenolic resin represented by the formula:

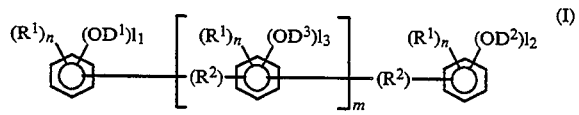

wherein $R^1$ is an alkyl group having 1 to 4 carbon atoms, $R^2$ is a bivalent hydrocarbon residue having 5 to 16 carbon atoms provided that groups bound to $R^2$ do not bind with the same carbon atom of $R^2$, $D^1$, $D^2$ and $D^3$ and are the same or different groups and each represent a hydrogen atom or a quinone diazido unit represented by

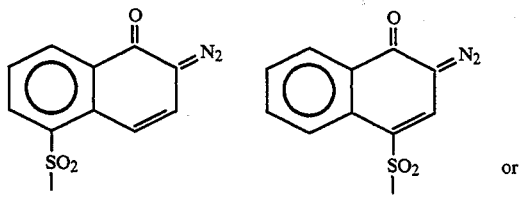

or

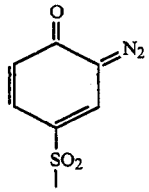

provided that a molar ratio of the hydrogen atom to the quinone diazido unit is 0 to 10, m is a number of 0 to 10, n is a number of 1 or 2, and $l_1$, $l_2$ and $l_3$ are the same or different numbers and each represent a number of 1 to 3; and (b) an alkali-soluble resin.

6 Claims, No Drawings

POSITIVE TYPE PHOTOSENSITIVE QUINONE DIAZIDE PHENOLIC RESIN COMPOSITION

BACKGROUND OF THE INVENTION

This invention relates to a novel positive type photosensitive resin composition which may be employed for the preparation of a printed circuit board, an integrated circuit or the like. More particularly, it relates to a novel positive type photosensitive resin composition which may be produced easily and which is excellent in compatibility with other resins and is capable of forming a coating film having adhesiveness onto a substrate.

In keeping up with recent progress in the field of electronic equipment, higher density, higher integration and smaller circuit size have been demanded of the printed circuit board as a holder or substrate. Consequently, a substrate surface mounting system, in which small-sized through-holes for electrical connection between the front and reverse substrate sides are formed in the substrate, has been adopted for mounting components on the substrate. The through-holes, which have their inner wall surfaces plated with metal, serve the purpose of interconnecting electrical circuits on the front and back sides of the substrate and securing the components in position.

For producing a printed circuit board having these through-holes and interconnection of a fine line-width by etching, it is necessary to protect a metal plating layer on the inner wall of the through-hole from an etching solution. However, with a method of laminating a dry photosensitive film, which is nowadays employed extensively, since the film thickness is generally as thick as 50 μm, a circuit pattern formed on light exposure and development is not well-defined, so that s fine circuit pattern cannot be formed. Besides, it is difficult to laminate a photosensitive film uniformly on the metal surface, so that the metal plating layer on the inner wall of a particularly small-sized through-hole cannot be protected satisfactorily.

On the other hand, if a resist is formed by an electrodeposition method capable of uniformly coating an etching resist, with the use of a current negative type electrodeposition photoresist consisting essentially of a photocurable resin, the inner part of the through-hole cannot be cured sufficiently because of shortage in the light volume irradiated into the through-holes, such that it becomes difficult to protect the plating metal layer on the inner wall surface against attack by the etching solution. For overcoming the above problems of the prior art, researches into a positive type electrodeposition photoresist, which has its exposed portion dissolved in a developing solution and its non-exposed portion turned into a protective layer and which can be uniformly applied to the substrate by electrodeposition, are currently proceeding, and a variety of proposals have been made. With the positive type photoresist, since the portion exposed to light becomes soluble in a solvent, so that the resist is dissolved and removed, while the portion not exposed to light is non-soluble in the solvent and hence is not removed but is left as a protective layer, it becomes possible to form the protective layer without the necessity of radiating the light to a recessed portion within the through-hole to which the light can be radiated only difficultly.

The above-mentioned positive type photoresist, in which a photosensitive component is a compound containing a quinone diazido group and a developing solution is an alkaline aqueous solution, is attracting attention because of its superior sensitivity and high resolution. If the positive type photoresist containing the quinone diazido group contains a group promoting dissolution in the alkaline aqueous solution and a quinone diazido group in one and the same resin, such photoresist is difficult to purify and hence is not desirable industrially. Therefore, a resin composition is currently employed which is composed of a resin or compound containing a quinone diazido group and a resin capable of promoting dissolution with respect to an alkaline aqueous solution. If the positive type photosensitive resin composition is to be produced by mixing the resin or compound having the quinone diazido group and the resin capable of promoting the dissolution at such a proper ratio as to assure optimum sensitivity, it is crucial to improve compatibility between the two components in order to achieve high resolution.

However, quinone diazido compounds, which may be produced currently on an industrial basis, exhibit only poor compatibility with an alkali-soluble resin, above all, a resin containing carboxylic groups, such as acrylic resin, so that the positive type photoresist solution or the positive type photoresist electrodeposition solution is low in stability and resolution and hence the performance of the resist can not be said to be unobjectionable.

SUMMARY OF THE INVENTION

It is an object of the present invention to provide a positive type photosensitive resin composition in which an alkali-soluble resin and a positive type photoresist exhibit superior compatibility and which exhibits superior stability when in the state of a solution or an electrodeposition solution.

The above and other objects of the present invention will become apparent from the following description.

According to the present invention, there is provided a positive type photosensitive resin composition containing:

(a) a quinone diazido phenolic resin represented by the formula;

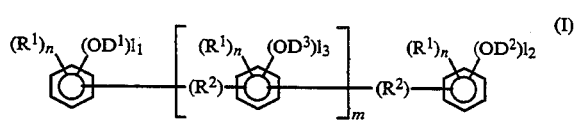

wherein $R^1$ is an alkyl group having 1 to 4 carbon atoms, $R^2$ is a bivalent hydrocarbon residue having 5 to 16 carbon atoms provided that groups bound to $R^2$ do not bind with the same carbon atoms of $R^2$, $D^1$, $D^2$ and $D^3$ are the same or different groups and each represent a hydrogen atom or a quinone diazido unit represented by

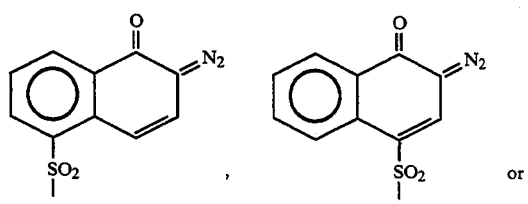

-continued

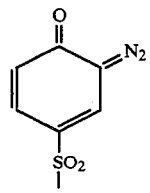

provided that a molar ratio of the hydrogen atom to the quinone diazido unit is 0 to 10, m is a number of 0 to 10, n is a number of 1 or 2, and $l_1$, $l_2$ and $l_3$ are the same or different numbers and each represent a number of 1 to 3; and (b) an alkali-soluble resin.

DESCRIPTION OF THE PREFERRED EMBODIMENTS.

The present invention will be explained in more detail hereinbelow.

The positive type photosensitive resin composition according to the present invention is characterized in that a particular quinone diazido phenolic resin and an alkali-soluble resin are contained therein as essential components.

The particular quinone diazido phenolic resin (a), employed as an essential component in the present invention is represented by the formula (I):

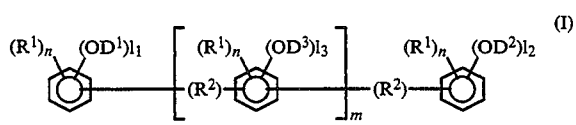

wherein $R^1$ is an alkyl group having 1 to 4 carbon atoms, $R^2$ is a bivalent hydrocarbon residue having 5 to 16 carbon atoms, $D^1$, $D^2$ and $D^3$ are the same or different groups and each represent a hydrogen atom or a quinone diazido unit represented by

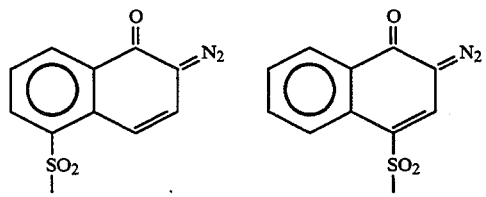

or

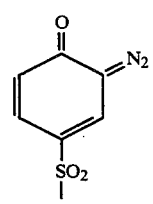

provided that a molar ratio of the hydrogen atom to the quinone diazido unit is 0 to 10, m is a number of 0 to 10, n is a number of 1 or 2, and $l_1$, $l_2$ and $l_3$ are the same or different numbers and each represent a number of 1 to 3.

In the above quinone diazido phenolic resin (a), if the number of carbon atoms of $R^1$ is 5 or more, if the number of carbon atoms of $R^2$ is 17 or more, if m is 11 or more or if n is 3 or more, manufacture is rendered difficult.

The above-mentioned quinone diazido phenolic resin (a) may preferably be enumerated by resins represented by the formulas indicated below, wherein m denotes a number of from 0 to 10, and $l_1$, $l_2$ and $l_3$ are the same or different numbers and each represent a number of 1 to 3:

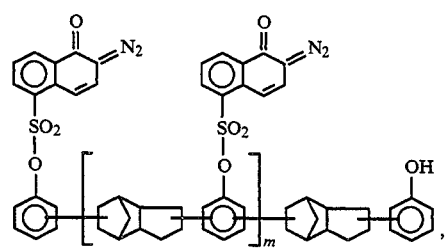

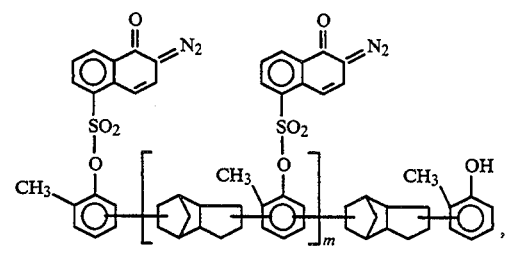

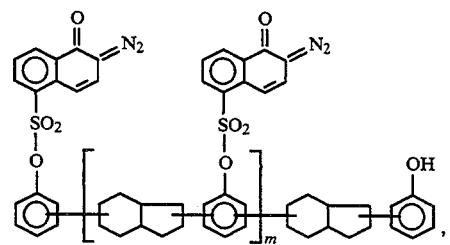

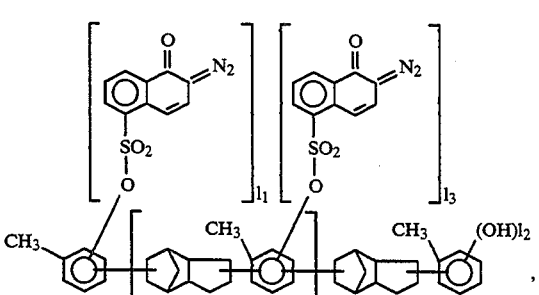

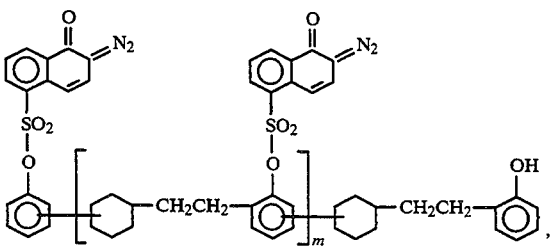

-continued

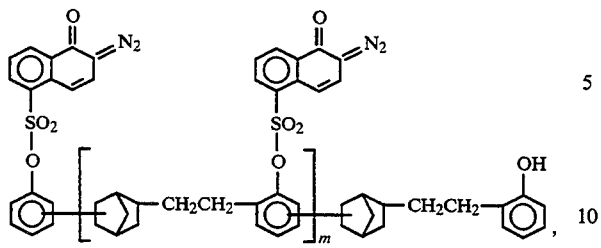

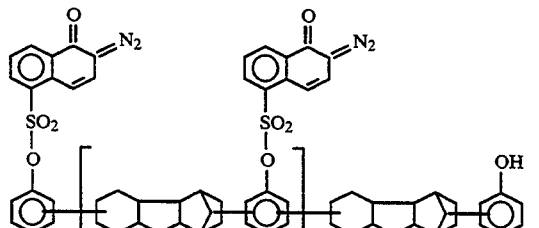

and

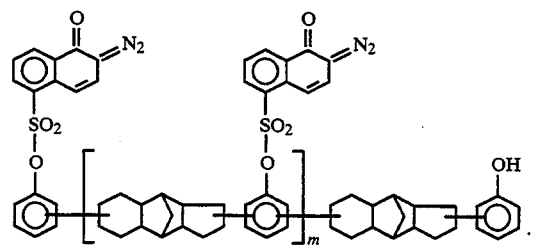

The above-mentioned quinone diazido phenolic resin (a) may be produced by reacting a phenolic resin represented by the formula (II)

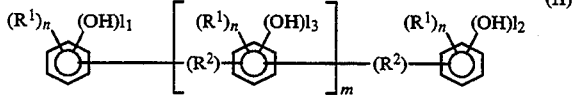
(II)

wherein $R^1 R^2$, m, n, $l_1$, $l_2$ and $l_3$ have the same meaning as in the formula (I), with a quinone diazido compound represented by the following formulas (III) to (V):

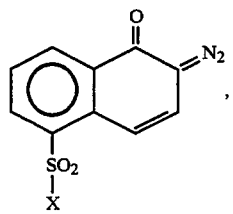
(III)

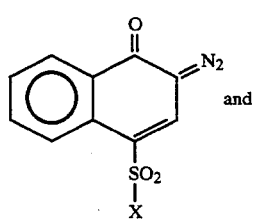
(IV)
and

-continued

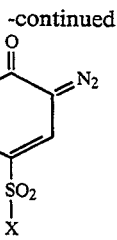
(V)

wherein X denotes a hydrogen atom, a fluorine atom, a chlorine atom, a bromine atom or an iodine atom.

The above-mentioned phenolic resins may be produced by copolymerizing a phenol represented by the formula (VI)

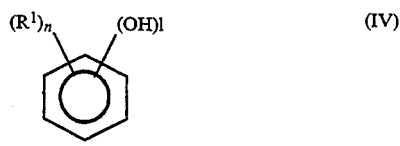
(IV)

where $R^1$ and n have the same meaning as those in formula (I) above and l is a number of 1 to 3, with an unsaturated C5 to C16 hydrocarbon having at least two carbon-carbon double bonds in the presence of a Lewis acid catalyst.

The phenolic compound of the above formula (VI), which may be employed as a starting material for the phenolic resin, may be enumerated by, for example a compound selected from the group consisting of phenol, o-cresol, m-cresol, p-cresol, t-butyl phenol, 2,4-dimethyl phenol, 2,6-dimethyl phenol, hydroquinone, catechol, methyl hydroquinone, pyrogallol, and mixtures thereof. Above all, phenols, cresols, xylenols, and polyhydric phenols with or without a substituted group are preferred because of properties of the produced resin, ease in purification and economic profitability. Naphthols may also be employed.

There is no particular limitation to the above-mentioned unsaturated hydrocarbons used as the other starting material of the phenolic resin, if it is C5 to C16 unsaturated hydrocarbon having at least two carbon-carbon double bonds. However, most preferred are a Dieis-Alder reaction product of a compound selected from the group consisting of a chained conjugated diene compound, such as butadiene, isoprene or piperylene; a cyclic conjugated diene compound, such as cyclopentadiene or methylcyclopentadiene; a cyclic terpene such as α-terpinene, β-terpinene or limonene and mixtures thereof. Specific examples of these hydrocarbons may preferably be the compounds given by the following formulas:

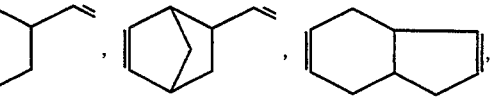

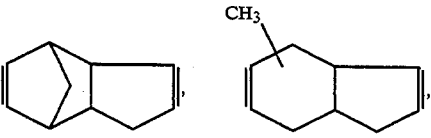

-continued

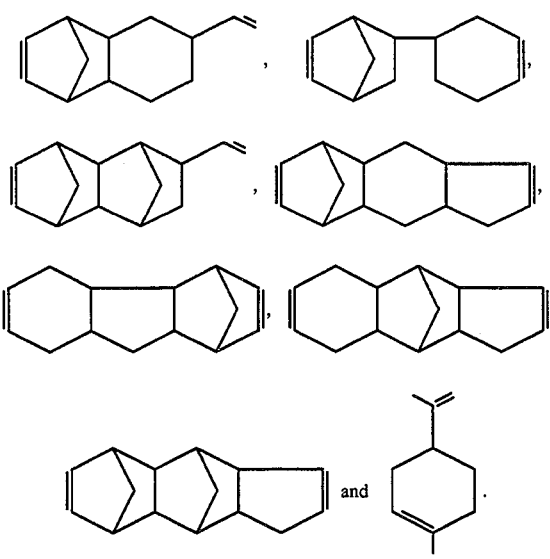

All of the above-mentioned Dieis-Alder reaction products are industrially available at reduced costs as intermediate products or by-products of a plant for producing 5-ethylidene norbornene, which is a third component of an ethylene propylene diene methylene rubber (EPDM).

The above-mentioned unsaturated hydrocarbons include cyclic diene compounds such as cyclopentadiene or methylcyclopentadiene, which may be used singly or as a mixture.

The charging ratio of the phenolic compound to the unsaturated hydrocarbons is 0.8 to 12 mol equivalents and preferably 1 to 8 mol equivalent to 1 mol of the above-mentioned unsaturated hydrocarbons. If the charging ratio of the phenolic compound is less than 0.8 mol equivalent, homopolymerization of the unsaturated hydrocarbons is simultaneously produced, whereas if the charging ratio exceeds 12 mol equivalents, a great deal of labor has to be expended in the recovery of unreacted phenols.

The above-mentioned Lewis acid catalysts employed in the production of the phenolic resin may preferably be enumerated by, for example boron trifluoride; boron trifluoride complexes such as ether, water, amine, phenol or alcohol complexes of trifluoride; aluminum compounds such as aluminum trichloride or diethyl aluminum monochloride; iron chloride; titanium tetrachloride; sulfuric acid; hydrogen fluoride; or trifluoromethane sulfonic acid. Above all, boron trifluoride, boron trifluoride ether complex, boron trifluoride phenol complex, boron trifluoride water complex boron trifluoride alcohol complex and boron trifluoride amine complex are preferred for activity and ease of catalyst removal. Most preferred are boron trifluoride and boron trifluoride phenol complex.

There is no particular limitation to the amount of the Lewis acid catalyst. Although the amount differs, depending upon the type of the Lewis acid catalyst, the boron trifluoride phenol complex catalyst, for example is used in an amount of 0.1 to 20 parts by weight and preferably 0.5 to 10 parts by weight to 100 parts by weight of the unsaturated hydrocarbons.

For producing the above-mentioned phenolic resin, the reaction may be carried out with or without the use of a solvent. If no solvent is used, it is preferred to use the phenolic compound in an amount exceeding an equivalent amount, preferably in an amount of 3 to 12 equivalents. There is no particular limitation to solvents used in preparing the phenolic resins if the solvent used does not obstruct the reaction. Most preferred are aromatic hydrocarbon compounds such as benzene, toluene or xylene.

Although the polymerization temperature used for preparing the phenolic resin differs depending on the type of the Lewis acid catalyst employed, it is usually 20° to 170° C. and preferably 50° to 150° C. if the boron trifluoride phenol complex catalyst is employed. If the reaction temperature exceeds 170° C., catalyst decomposition or secondary reaction may tend to be produced. On the other hand, if the polymerization temperature is lower than 20° C., the reaction may tend to be retarded to incur economic demerits.

For producing the phenolic resin, it is desirable to diminish the moisture in the system to as small a value as possible, above all to 100 ppm or less by weight, to permit smooth progress of the reaction. The method of progressively adding the unsaturated hydrocarbons for polymerization at the time of reaction of the unsaturated hydrocarbons with the phenols is desirable in order to permit smooth progress of the reaction as well as to prevent homopolymerization of the unsaturated hydrocarbons and to remove the heat of reaction. After the end of copolymerization reaction between the phenolic compound and the unsaturated hydrocarbons, the phenolic resin may be obtained after removal of the Lewis acid catalyst followed by concentration. The method of removing the Lewis acid catalyst differs from one catalyst type to another. If the catalyst employed is a boron trifluoride phenol complex, it may be removed by adding calcium hydroxide or magnesium hydroxide in an amount of 1 to 10 times of mols as large as that of the catalyst for deactivating the catalyst and filtering off the catalyst. For filtration, it is preferred to improve the operability by adding a suitable solvent or by raising the temperature of a filtrate.

The charging ratio of the quinone diazido compound represented by the formulas (III) to (V) to the phenolic resin for the preparation of the quinone diazido phenolic resin employed in accordance with the present invention is preferably 0.1 to 1.0 mole equivalent and more preferably 0.3 to 1.0 mole equivalent per each hydroxyl group of the phenolic resin. The charging ration outside the above range is not preferred because sufficient sensitivity required of a photosensitive resist cannot be obtained.

For reacting the above-mentioned quinone diazido compound with the phenolic resin, it is preferred to carry out the reaction in the presence of a base and an inert organic solvent capable of dissolving both reaction components at a reaction temperature usually of 10° to 80° C. and preferably 20° to 60° C. for 10 minutes to 50 hours and preferably 1 to 15 hours. The inert organic solvent which may be employed may preferably be enumerated by dioxane, acetone, tetrahydrofuran, methylethylketone, methylisobutylketone, benzene, toluene and xylene, while the base may preferably be enumerated by alkali metal salts such as sodium carbonate, sodium hydroxide, potassium hydroxide, or potassium carbonate; and amines such as triethylamine, triethanolamine, tributylamine, dimethylbenzylamine or pyridine.

After the end of the above reaction, salts by-produced by the reaction are filtered off and the remaining reaction solution is supplied dropwise to a large amount of pure water to allow precipitation of the quinone diazido phenolic resin (a). The resulting quinone diazido phenolic resin (a) may be purified by washing with water several times followed by filtration and drying.

There is no particular limitation to the alkali-soluble resin (b) employed as the other essential component in the positive type photosensitive resin composition, if it is such resin exhibiting solubility with respect to alkalis. Specifically, the resin may be enumerated by, for example by resins containing phenolic hydroxyl groups and resins containing carboxyl groups. Above all, the resins containing carboxyl groups are most preferred because the positive type photosensitive resin composition may be applied on the substrate by an electrodeposition coating method.

The resin containing the phenolic hydroxyl groups may preferably be enumerated by, for example novolak phenol resin, bisphenol A phenol resin and polyvinyl phenol resin.

The resin containing carboxyl groups may preferably be enumerated by (meth)acrylic resins obtained by co-polymerizing acrylic and/or methacrylic acid with a monomer containing an ethylenic unsaturated bond; maleic acid copolymers obtained by copolymerizing maleic acid, maleic anhydride, fumaric acid, or mixtures thereof with a monomer containing an ethylenic unsaturated bond; and maleinated polybutadiene.

The monomers containing the ethylenic unsaturated bond employed as a starting material for the above-mentioned (meth)acrylic resin or maleic acid copolymer may preferably be enumerated by alkyl(meth)acrylates such as methyl acrylate, methyl methacrylate, ethyl acrylate, ethyl methacrylate, butyl acrylate, butyl methacrylate, 2-ethylhexyl acrylate, and 2-ethylhexyl methacrylate; aromatic compounds containing ethylenic unsaturated bonds such as styrene, α-methyl styrene, vinyl toluene, or t-butyl styrene; α-olefins such as ethylene or propylene; and diene compounds such as butadiene or isoprene.

For preparing the above-mentioned resin containing (meth)acrylic acid units or maleic acid copolymer, a well-known polymerization method and a conventional radical polymerization initiator may be employed. Examples of the polymerization initiators may preferably include peroxides such as benzoyl peroxide, t-butyl oxide, or cumene hydroperoxide, azo compounds such as azobisisobutylonitrile or azobiscyano valetic acid, and inorganic radical initiators such as potassium persulfate, ammonium persulfate or hydrogen peroxide.

There is no particular limitation to the charging amounts of the starting monomers employed for the preparation of the resin containing (meth)acrylic acid units or the maleic acid copolymer and such charging amounts may be suitably selected depending on the acid value as required for the positive type photosensitive resin composition. For preparing the resin containing (meth)acrylic acid units, a monomer having ethylenic unsaturated bonds is preferably employed in an amount usually of 100 to 2000 parts by weight and more preferably 150 to 1500 parts by weight to 100 parts by weight of acrylic acid and/or methacrylic acid. On the other hand, for preparing the maleic acid copolymer, the monomer containing ethylenic unsaturated bonds is employed in an amount usually of 100 to 2000 parts by weight and preferably 150 to 1500 parts by weight to 100 parts by weight of the above-mentioned maleic acid, maleic anhydride, fumaric acid or mixtures thereof.

If the above-mentioned maleic acid copolymer is employed as an alkali-soluble resin (b), a part of acid anhydride groups and/or dicarboxyl groups possessed by the maleic acid copolymer may be added with alcohol or water or may be imidated with a view to improving compatibility with the quinone diazido phenolic resin (a) as well as raising the softening point of a coating film and adjusting the acid value. If all of the reactions for imidization, alcohol addition and water addition are to be carried out, there is no particular limitation to the sequence of these reactions. It is noted that the acid anhydride group may readily be opened with water into the corresponding dicarboxyl group, whereas the dicarboxyl group may readily be dehydrated on heating to a corresponding acid anhydride group.

The above-mentioned imidization may be carried out by reacting an amino compound containing aromatic rings such as a primary amine compound, e.g. aniline, benzylamine, 4-methyl benzylamine or 1-aminoindene, with the above-mentioned maleic acid copolymer. The reaction temperature may be in the range usually of 0° to 300° C. and preferably 50° to 200° C.

The proportion of imidization of the acid anhydride groups and/or dicarboxyl groups by the imidizing reaction may be suitably selected depending on the acid value required of the alkali-soluble resin (b), the softening point of the coating film, etc. For example, the proportion of imidization may be in the range of from 0.1 to 0.8 and preferably 0.2 to 0.7 to one acid anhydride group and/or dicarboxyl group possessed by the maleic acid copolymer.

The alcohol addition may be carried out by reacting alcohols, such as methanol, ethanol, propanol, butanol or benzyl alcohol and/or cellosolves, such as methyl cellosolve, ethyl cellosolve, butyl cellosolve or phenyl cellosolve, with the above-mentioned maleic acid copolymer. The reaction temperature for alcohol addition reaction may usually be 0° to 300° C. and preferably 50° to 200° C.

The proportion of alcohol addition by the above-mentioned alcohol addition reaction may be suitably selected depending on the acid value required of the ultimate alkali-soluble resin (b). For example, it suffices to add usually 0.1 to 1.2 and preferably 0.2 to 1.0 alcohol groups to one maleic anhydride group and/or dicarboxyl group possessed by the maleic acid polymer.

For carrying out the above-mentioned imidization and alcohol addition, it is preferred to use a solvent which is not reactive with respect to and is capable of dissolving the respective reaction components. Examples of the solvents which may be employed include aromatic hydrocarbons such as toluene or xylene; ketones such as methylethylketone or methylisobutylketone; esters such as ethyl acetate; ethers not containing hydroxyl groups such as diethyleneglycol dimethyl ether or triethyleneglycol dimethyl ether; and tertiary alcohols such as diacetone alcohol.

The above-mentioned water addition is an addition reaction for ring-opening of the acid anhydride group by water addition. Such reaction may be produced with water yielded by imidization or alcohol addition or water added during water dispersion as later described and thus without a separate step of adding water to the reaction system. All of the residual acid anhydride groups may be ring-opened to give carboxyl groups by such reaction of water addition.

As for the above-mentioned maleinated polybutadiene which may be employed as the resin containing carboxyl groups, those produced by the method described in detail in Japanese Patent Publication No.46-11195 may preferably be employed. Specifically, a maleinated polybutadiene may preferably be employed which is obtained by reacting a polybutadiene containing a carbon-carbon double bond and having a molecular weight usually of 300 to 30,000 and preferably 500 to 50,000 and an iodine value usually of 50 to 500 and preferably 100 to 470 with maleic acid or maleic anhydride in amounts of 0.05 to 0.7 mol and preferably 0.1 to 0.5 mol of maleic acid or maleic anhydride to 100 g of polybutadiene. The reaction of adding maleic acid or maleic anhydride to polybutadiene may usually be carried out by mixing at a temperature of 100° to 300° C. During the above reaction, phenylene diamines, pyrogallols or naphthols my be optionally added to the reaction system for preventing gelation.

Similarly to the above-mentioned maleic acid copolymer, the maleinated polybutadiene may be optionally treated with imidization, alcohol addition and/or water addition. The proportion of the imidization or alcohol addition may be suitably selected depending on the softening point of the coating film or the acid value required of the alkali-soluble resin (b). For imidization, for example it suffices to imidize 0.1 to 0.8 and preferably 0.2 to 0.7 to one acid anhydride and/or succinic acid group possessed by maleinated polybutadiene. For alcohol addition, it suffices to add usually 1 to 1.2 and preferably 0.2 to 1.0 alcohol units to one acid anhydride group and/or succinic acid group possessed by the maleinated polybutadiene.

The number average molecular weight of the alkali-soluble resin (b) employed as the essential component in the present invention may preferably be 500 to 10,000. If the number average molecular weight is less than 500, the protective layer may be lowered in strength, whereas if it exceeds 10,000, the light-irradiated portion may be lowered in solubility with respect to the developing solution.

The acid value of the alkali-soluble resin (b) may preferably be in the range of from 40 to 250 mg KOH/g. If the acid value is less than 40 mg KOH/g, the light-irradiated portion may be lowered in solubility with respect to the developing solution, whereas if it exceeds 250 mg/KOH/g, the non-irradiated portion may also undesirably be dissolved in the developing solution.

The proportion of the quinone diazido phenolic resin (a) to the alkali-soluble resin (b) employed as essential components in the present invention may usually be 5 to 100 parts by weight and preferably 10 to 50 parts by weight to 100 parts by weight of the alkali-soluble resin (b). If the proportion of the quinone diazidized phenolic resin (a) is less than 5 parts by weight, the amount of carboxylic acid generated in the light-irradiated portion may be diminished to render development with a weakly alkaline developing solution difficult, whereas if the proportion exceeds 100 parts by weight, the coating film may undesirably be susceptible to cracking.

When the positive type photosensitive resin composition according to the present invention is used, the positive type photosensitive resin composition is dissolved with a solvent and coated on a substrate to form a positive type photosensitive coating film, and a predetermined pattern mask is applied to the resulting coating film, exposed to light and subsequently developed. The solvent which may be employed may be enumerated by alcohols, such as ethyl cellosolve, propyl cellosolve, butyl cellosolve, or diacetone alcohol; ethers such as ethyleneglycol dimethyl ether or diethyleneglycol dimethyl ether; ketones such as methylethylketone or methylisobutylketone; esters such as ethoxy ethyl acetate or phenoxy ethyl acetate; and amidos such as methyl pyrrolidone or dimethyl formamide. The methods of coating the dissolved composition on the substrate may include a screen printing method, a spray coating method, an immersion coating method or coating with a spinner. The last mentioned method of employing the spinner renders it possible to reduce the film thickness to provide a resist having superior tight contact properties with the substrate and hence is suited to the production of integrated circuits.

If in the positive type photosensitive resin composition of the present invention, a resin containing carboxyl groups is used as the alkali-soluble resin (b), such resin may be neutralized with an alkali and dispersed or dissolved in water to give an aqueous solution of the positive type photosensitive resin which may be coated by immersion coating or electrodeposition coating on a metal layer. Although there is no particular limitation to the method for neutralization, a method of neutralization may be employed which consists in adding 0.2 to 1.0 mol equivalent and preferably 0.3 to 0.8 mol equivalent of an organic amine such as trimethylamine, triethylamine or dimethyl ethanol amine, to 1 mol of carboxyl group in the positive type photosensitive resin composition for neutralization. There is also no limitation to the neutralization temperature which may for example be 0° to 120° C. and preferably the ambient temperature.

For facilitating dispersion and dissolution into water by neutralization and improving stability of the produced aqueous solution or aqueous dispersion, an organic solvent may be added which not only is soluble in water but also is capable of dissolving the positive type photosensitive resin composition. Such organic solvent may preferably be enumerated by ethyl cellosolve, butyl cellosolve, ethyleneglycol dimethyl ether, diethyleneglycol dimethyl ether, diacetone alcohol and methylethylketone. The proportion of the organic solvent is usually 10 to 100 parts by weight and preferably 20 to 80 parts by weight to 100 parts by weight of the positive type photosensitive resin composition. Also an organic solvent which is hydrophobic and capable of dissolving the positive type photosensitive resin composition may be added for improving flowing properties during drying after electrodeposition. The hydrophobic organic solvent may preferably be enumerated by hexyl cellosolve, phenyl cellosolve, propylene glycol monophenyl ether, acetophenone, acetonaphthone, benzyl acetone, benzyl acetate, methyl benzoate, ethyl benzoate, butyl benzoate, cylohexane and phenoxyethyl acetate. The proportion of the hydrophobic organic solvent is usually 10 to 100 parts by weight and preferably 15 to 80 parts by weight to 100 parts by weight of the positive type photosensitive resin composition.

For forming an image using an aqueous solution of the positive type photosensitive resin of the present invention dispersed or dissolved in water, the aqueous solution of the positive type photosensitive resin is used as an electrodeposition solution for coating on a substrate by an electrodeposition coating method. On the so-formed positive type photosensitive coating film, a predetermined pattern mask is tightly contacted, exposed to light and subsequently developed.

For electrodeposition coating, a substrate coated on its entire surface inclusive of through-holes with an electrically conductive metal layer is immersed as an anode in an electrodeposition solution, and dc current is caused to flow through the electrodeposition solution.

The film thickness of the above-mentioned positive type photosensitive coating film may be controlled easily by the solution temperature, current conduction time, current density, etc. for producing a desired film thickness according to usage and application. Specifically, the electrodeposition conditions for producing a standard film thickness of 5 to 20 μm include a solution temperature of 25° C., a current conduction time of 0.05 to 10 minutes and a current density of 0.1 to 5.0 mA/cm$^2$ (constant current).

After the end of the electrodeposition, the substrate is taken out of the electrodeposition solution, washed with water and dried. The drying temperature at this time is preferably 50° to 120° C. If the drying temperature is lower than 50° C., sufficient drying may not be achieved, whereas if the drying temperature is higher than 120° C., quinone deazido groups may be decomposed.

There is no particular limitation to the types of a light source employed for light exposure. For example, a high pressure mercury lamp, an ultra-high pressure mercury lamp, xenone lamp or a metal halide lamp may preferably be employed.

The image formed on the substrate may be developed by spraying a weakly alkaline aqueous developing solution to the substrate or by immersing the substrate in a weakly alkaline aqueous developing solution. There is no particular limitation to the weakly alkaline aqueous developing solution if it is able to dissolve a light-exposed portion of the substrate and unable to dissolve a non-exposed portion of the substrate. Examples of the weakly alkaline aqueous developing solution include aqueous solutions of sodium carbonate, potassium carbonate, sodium metasilicate, potassium metasilicate, sodium hydroxide, potassium hydroxide, ammonia water and tetramethyl ammonium hydroxide. The pH value of the solution is usually on the order of 8 to 13.

If the substrate is a printed circuit board, a copper foil exposed on the substrate is etched with cuptic chloride or ferric chloride and ultimately a positive type photosensitive coating film in the unexposed portion of the substrate is peeled off by strong alkali such as potassium hydroxide to produce a circuit pattern.

The positive type photosensitive resin composition according to the present invention can be purified easily and exhibits high sensitivity because the quinone diazido phenolic resin (a) showing high compatibility with the alkali-soluble resin (b) without regard to the solvent type is used as a photosensitive component. The positive type photosensitive resin composition of the present invention is most suitable for an electrodeposition coating method if a resin containing carboxyl groups is employed as the alkali-soluble resin (b). The coating film of the electrodeposited positive type photosensitive resin exhibits superior tight contacting properties with respect to the substrate and is capable of forming a fine pattern for wires. Besides, the composition exhibits superior long-term stability when used as an electrodeposition solution.

EXAMPLES OF THE INVENTION

The present invention is hereinafter explained with reference to Examples which are given only for illustration and are not intended for limiting the invention.

SYNTHESIS EXAMPLE 1

Synthesis of Phenolic Resin (F-1)

1500 g of phenol and 300 g of toluene were charged into a 5 lit. reactor fitted with a reflux cooler and a Liebig condenser and heated to 170° C. for distilling off 250 g of toluene, thus reducing the moisture in the reaction system to 60 ppm. The reaction system was cooled to 80° C. and 12 g of boron trifluoride phenol complex was added to the reaction system. 300 g of dicyclopentadiene with water content of 20 ppm were gradually added dropwise over 2.5 hours while the reaction temperature was controlled to be 80° C. After the end of the dropwise addition, reaction was carried out at 80° C. for 0.5 hour. After the end of the reaction, 36 g of a magnesium compound manufactured and sold by KYOWA CHEMICAL INDUSTRY CO., LTD. under the trade name of "KW-1000" were added to the reaction system. After agitation for 30 minutes for deactivating the catalyst, a reaction solution was filtered using a filter paper overlaid with celite. The produced transparent filtrate was distilled under vacuum at 240° C. to produce 560 g of the phenolic resin (F-1) shown by the following formula:

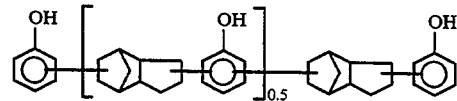

The produced phenolic resin (F-1) had a softening point of 96° C. The equivalent of a phenolic hydroxyl group, as measured by back titration after acetylation of the phenolic hydroxyl groups with acetic anhydride, was 173 g/eq.

On $^1$H-NMR analyses, a proton coupled to an aromatic ring was observed at σ6.5 to 7.5 ppm and a proton of a naphthene ring was observed at σ0.8 to 2.5 ppm, while absorption of the proton coupled to a double bond was not noticed. In the $^1$H-NMR analyses, the content of the phenolic hydroxyl groups was found from the peak area ratio of σ6.5 to 8 ppm to σ0.8 to 2.5 ppm. The value of the equivalent of the phenolic hydroxyl groups was found to be 173 g/eq, in agreement with the results obtained by titration. Besides, since no signal of a carbon of 158 ppm generated on ether addition of a phenolic double bond is observed on $^{13}$C-NMR analyses, it is seen that phenol is added by alkylation. The number average molecular weight of the resin, as found by GPC analyses, was 430.

SYNTHESIS EXAMPLE 2

Synthesis of Phenolic Resin (F-2)

Reaction was carried out in the same way as in Synthesis Example 1, except using 1600 g of o-cresol in place of phenol, and 560 g of a phenolic resin (F-2) represented by the following formula:

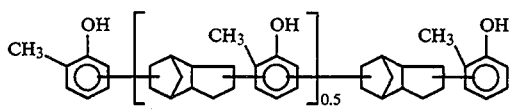

was produced.

The produced phenolic resin ( F-2 ) had a softening point of 92° C. and a phenolic hydroxyl group equivalent, as found by titration, of 187 g/eq. $^1$H-NMR analysis revealed that no absorption of proton coupled to double bonds was noticed. The content of the phenolic hydroxyl groups was found from the peak area ratio. It was found that the phenolic hydroxyl group equivalent was 187 g/eq in agreement with the results obtained by titration. The number average molecular weight of the resin, as found by the GPC analyses, was 470.

SYNTHESIS EXAMPLE 3

Synthesis of Phenolic Resin (F-3)

1600 g of phenol and 300 g of toluene were charged into a 5 lit. reactor fitted with a reflux cooler and a Liebig condenser and heated to 170° C. for distilling off 250 g of toluene, thus reducing the moisture in the reaction system to 70 ppm. The reaction system was cooled to 80° C. and 28 g of boron trifluoride phenol complex was added to the reaction system. 400 g of tetrahydroindene with water content of 20 ppm were gradually added dropwise over 2 hours while the reaction temperature was controlled to be 80° C. After the end of the dropwise addition, reaction was carried out at 140° C. for three hours. After the end of the reaction, 78 g of a magnesium compound manufactured and sold by KYOWA CHEMICAL INDUSTRY CO., LTD. under the trade name of "KW-1000" were added to the reaction system. After agitation for 30 minutes for deactivating the catalyst, a reaction solution Was filtered using a filter paper overlaid with celite. The produced transparent filtrate was distilled under vacuum at 230° C. to produce 410 g of the phenolic resin (F-3) shown by the following formula:

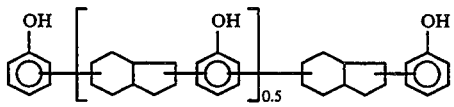

The produced phenolic resin (F-3) had a softening point of 105° C. The hydroxyl group equivalent of the phenolic resin (F-3) was 195 g/eq.

SYNTHESIS EXAMPLE 4

Synthesis of Phenolic Resin (F - 4)

Reaction was carried out in the same way as in Synthesis Example 3, except using vinylcyclohexene in place of tetrahydroindene, and 390 g of a phenolic resin (F-4) represented by the following formula:

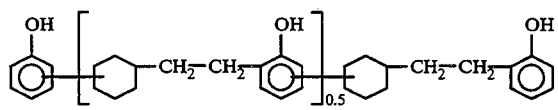

was produced.

The produced phenolic resin ( F-4 ) had a softening point of 104° C. and a phenolic hydroxyl group equivalent of 196.

SYNTHESIS EXAMPLE 5

Synthesis of Phenolic Resin (F-5)

Reaction was carried out in the same way as in Synthesis Example 3, except using vinylnorbornene in place of tetrahydroindene, and 380 g of a phenolic resin (F-5) represented by the following formula

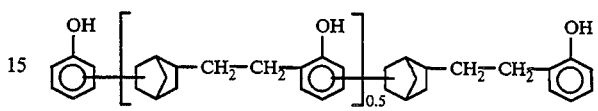

was produced.

The produced phenolic resin (F-5) had a softening point of 109° C. and a phenolic hydroxyl group equivalent of 200 g/eq.

SYNTHESIS EXAMPLE 6

Synthesis of Phenolic Resin (F-6)

Reaction was carried out in the same way as in Synthesis Example 3, except using 300 g of a Dieis-Alder reaction product of butadiene and cyclopentadiene in place of dicyclopentadiene, and 560 g of a phenolic resin mixture (F-6) shown by the following formulas

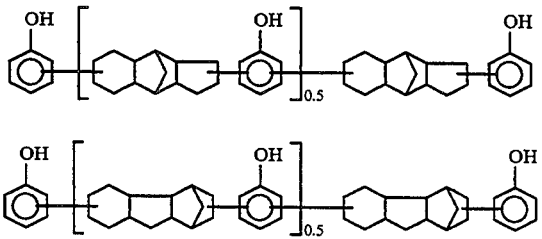

was produced.

The produced copolymerization product (F-6) had a softening point of 110° C. and an equivalent of phenolic hydroxyl groups was 205 g/eq.

SYNTHESIS EXAMPLE 7

Synthesis of Phenolic Resin (F-7)

Reaction was carried out in the same way as in Synthesis Example 1, except using cathecol in place of phenol, and 560 g of a phenolic resin (F-7) represented by the following formula:

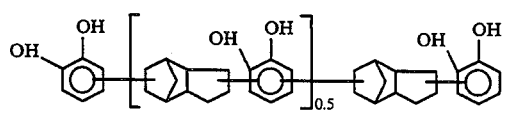

was produced.

The produced phenolic resin (F-7) had a solftening point of 115° C. and a phenolic hydroxyl group equivalent of 94.

SYNTHESIS EXAMPLE 8

1000 g of polybutadiene (manufactured and sold by NIPPON PETROCHEMICALS CO., LTD. under the trade name of "B-1000"; number average molecular weight of 1000, iodine value of 430 and content of 1,2 bonds of 65%), 751 g of maleic anhydride, 5.0 of a gelation inhibiting agent manufactured and sold by SUMITOMO CHEMICAL CO., LTD. under the trade name of "ANTIGEN 6C" and 10 g of xylene were charged into a 3 lit. separable flask fitted with a reflux cooling tube and a nitrogen blowing pipe, and reaction was carried out under a nitrogen stream at 190° C. for five hours. Non-reacted maleic anhydride and xylene were distilled off to give maleinated polybutadiene.

The total acid value of the produced maleinated polybutadiene was found to be 480 gKOH/g. Then, 500 g of the produced maleinated polybutadiene with the total acid value of 480 mgKOH/g and 250 g of diethyleneglycol dimethyl ether were charged into a 2 lit. separable flask fitted with a reflux cooling tube and dissolved uniformly. 148 g of benzylamine were supplied dropwise to the reaction system at 130° C. under a nitrogen stream. After the end of the dropwise addition, the temperature of the solution was raised to 165° C. and reaction was continued for 7 hours while the temperature was maintained. In this manner, an alkali-soluble resin solution containing dicarboxyl groups and imide groups, was produced. The produced resin solution contained 72 wt. % of non-volatile components and 169 mg equivalent of carboxyl groups per 100 g of the solution.

SYNTHESIS EXAMPLE 9

269 g of 1,2-naphthoquinone diazido-5-sulfonyl chloride, 1900 g of dioxane and 216 g of the phenolic resin (F-1) synthesized by Synthesis Example 1, were charged into a 5 lit. separable flask fitted with a reflux cooling tube. After dissolution, 101 g of triethylamine were added dropwise over two hours while the temperature was maintained at 30° C.

The reaction was continued for five hours, while the temperature was maintained at 30° C. After extinction of 1,2-naphthoquinone diazido-5-sulfonyl chloride was confirmed by TLC, chlorates of triethylamine were removed by filtration. A resulting reaction solution was added dropwise to pure water having a volume 20 times as large as the reaction solution to permit precipitation of a resin, which was then filtered, washed with water and dried to give a naphthoquinone diazido phenolic resin (N-1) shown by the following formula

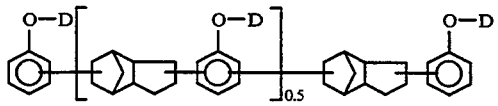

where 80% of D in the formula is

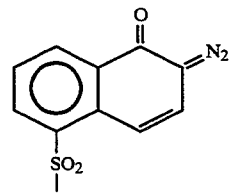

with the balance being hydrogen atoms.

On IR analyses of the produced resin, two acute peaks ascribable to diazido groups were observed at 2166 cm$^{-1}$ and 2120 cm$^{-1}$, while the peaks ascribable to phenolic OH were diminished. The amount of the naphthoquinone diazido groups, as found by elementary analysis for sulfur, was 2.23 mg equivalent/g.

SYNTHESIS EXAMPLES 10 TO 15

Reaction and analyses were carried out in the same way as in Synthesis Example 9, except using the charging ratios shown in Table 1 and using the phenolic resins (F-2) to (F-7) shown in Table 1 in place of the phenolic resin (F-1) to produce quinone diazido phenolic resins (N-2) to (N-7) shown in Table 1. The results are shown in Table 1.

TABLE 1

| Synth. Ex. | Phenolic Resin | Amount of Phenolic Resin (g) | Amount of 1,2-naphthoquinone Diazido Sulfonyl Chloride (g) | Content of Quinone Diazido (mg eq./g) | Quinone Di-azidized Phenol |
|---|---|---|---|---|---|
| 9 | F-1 | 216 | 269 | 2.23 | N-1 |
| 10 | F-2 | 234 | 269 | 2.15 | N-2 |
| 11 | F-3 | 244 | 269 | 2.10 | N-3 |
| 12 | F-4 | 245 | 269 | 2.09 | N-4 |
| 13 | F-5 | 250 | 269 | 2.07 | N-5 |
| 14 | F-6 | 256 | 269 | 2.05 | N-6 |
| 15 | F-7 | 118 | 269 | 2.84 | N-7 |

EXAMPLE 1

111 g of the alkali-soluble resin solution synthesized in Synthesis Example 8, 20 g of the resin (N-1) synthesized in Synthesis Example 9 and 35 g of phenoxyethyl acetate were mixed together and admixed with 7.5 g of triethylamine for neutralization sufficiently. Demionized water was added to the resulting mixture so that the solid content amounted to 10 wt % to produce an electrodeposition solution of a positive type photosensitive resin composition.

A copper-lined laminated substrate for print wiring having through-holes was immersed as an anode in the resulting electrodeposition solution and direct current of 2 mA/cm$^2$ was supplied for 20 sec. After washing with water and drying at 100° C. for 5 minutes, an electrodeposition coating film of a positive type photosensitive resin composition having a film thickness of 7 μm was produced. A photomask of a positive pattern was tightly contacted in vacuum with the film and irradiated with UV rays of a wavelength of 365 nm and a light exposure quantity of 300 mJ/cm$^2$, using an ultra high pressure mercury lamp. Spray development was then carried out at 30° C. for 60 sec using a 1.0 wt % aqueous solution of sodium carbonate. The produced protective layer exhibited a line width equal to the pattern line width, while peeling of the protective layer, pinholes or cracking was not observed. After copper etching with a ferric chloride solution and immersion in a 4 wt % sodium metasilicate solution at 40° C. for 60 sec for removing the protective layer, a circuit pattern of 30 μm line width completely free of defects was obtained. Copper in the through-holes was protected from the etching solution and was left intact. After the electrodeposition solution was allowed to stand for three months at room temperature, there was no resin precipitation, and no abnormality was observed after repeated use of the solution.

EXAMPLE 2

111 g of a butyl cellosolve solution with solids concentration of 60 wt % manufactured by TOAGOSEI CHEMICAL INDUSTRY CO., LTD. under the trade name of "S-4030" and 20 g of resin (N-2) synthesized in Synthesis Example 10 were mixed together and 7.5 g of triethylamine was added to the mixture. After the resulting mass was neutralized thoroughly, deionized water was added to the mixture so that the solid content amounted to 10 wt % to produce an electrodeposition solution of a positive type photosensitive resin composition.

Electrodeposition, light exposure and development were carried out in the same way as in Example 1. The produced protective layer exhibited a line width equal to the pattern line width, while peeling of the protective layer, pinholes or cracking was not observed. After copper etching with a ferric chloride solution and immersion in a 4 wt % sodium metasilicate solution at 40° C. for 60 sec for removing the protective layer, a circuit pattern of 30 μm line width completely free of defects was produced. Copper in the through-holes was protected from the etching solution and was left intact. After the electrodeposition solution was allowed to stand for three months at room temperature, there was no resin precipitation, and no abnormality were observed after repeated use of the solution.

EXAMPLES 3 TO 6

Electrodeposition solutions were prepared in the same way as in Example 1 except using the resin (N-3) for Example 3, the resin (N-4) for Example 4, the resin (N-5) for Example 5 and the resin (N-6) for Example 6 in place of resin (N-1). After electrodeposition was carried out in the same way as in Example 1, using each produced electrodeposition solution, a photomask was similarly exposed to light and developed.

With the use of any of the resins (N-3) to (N-6), the produced protective layer exhibited a line width equal to the pattern line width, while peeling of the protective layer, pinholes or cracking was not observed. After copper etching with a ferric chloride solution and immersion in a 4 wt % sodium metasilicate solution at 40° C. for 60 sec for removing the protective layer, each circuit pattern of 30 μm line width completely free of defects was produced. After copper etching with a ferric chloride solution and immersion in a 4 wt % sodium metasilicate solution at 40° C. for 60 sec for removing the protective layer, each circuit pattern of 30 μm line width completely free of defects was obtained. Copper in the through-holes was protected from the etching solution and was left intact. After each electrodeposition solution was allowed to stand for three months at room temperature, there was no resin precipitation, and no abnormality were observed after repeated use of the solution.

EXAMPLE 7

80 g of a novolak phenolic resin (with a hydroxyl equivalent of 110), 20 g of resin (N-1) synthesized in Synthesis Example 9 and 100 g of diethyleneglycol dimethyl ether were mixed together to be solubilized one another and coated on a silicon oxide film wafer using a spinner. After drying at 100° C. for 5 minutes, a coating film of a positive type photosensitive resin composition having a film thickness of 2 μm was obtained.

A photomask having a positive pattern was intimately contacted with the coating film and irradiated with UV rays of a wavelength of 365 nm and a light exposure volume of 100 mJ/cm$^2$, using an ultra-high pressure mercury lamp. After immersion for 70 sec in a 2.38 wt % aqueous solution of tetramethyl ammonium hydroxide at 23° C. and development, a protective layer having a line width of 1.0 μm free of peeling of the protective layer, pinholes or cracking was produced.

EXAMPLE 8

80 g of a novolak phenolic resin (with a hydroxyl equivalent of 110), 12 g of resin (N-7) synthesized in Synthesis Example 15 and 200 g of ethyl acetate cellosolve were mixed together to be solubilized one another and coated on a silicon oxide film wafer using a spinner. After drying at 100° C. for 5 minutes, a coating film of a positive type photosensitive resin composition having a film thickness of 1 μm was obtained.

A photomask having a positive pattern was intimately contacted with the coating film and irradiated with UV rays of a wavelength of 365 nm and a light exposure volume of 100 mJ/cm$^2$, using an ultra-high pressure mercury lamp. After immersion for 70 sec in a 2.38 wt % aqueous solution of tetramethyl ammonium hydroxide at 23° C. and development, a protective layer having a line width of 1.0 μm free of peeling of the protective layer, pinholes or cracking was produced.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A positive type photosensitive resin composition comprising:

(a) from 5 to 100 parts by weight of a quinone diazido phenolic resin selected from the group consisting of compounds represented by the formulae:

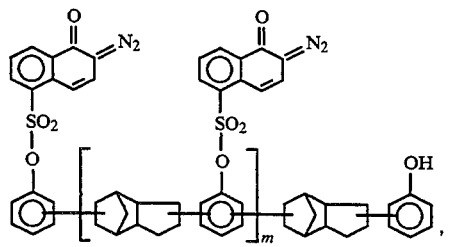

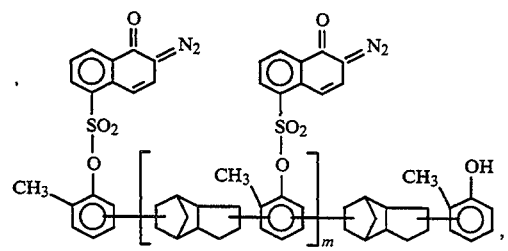

-continued

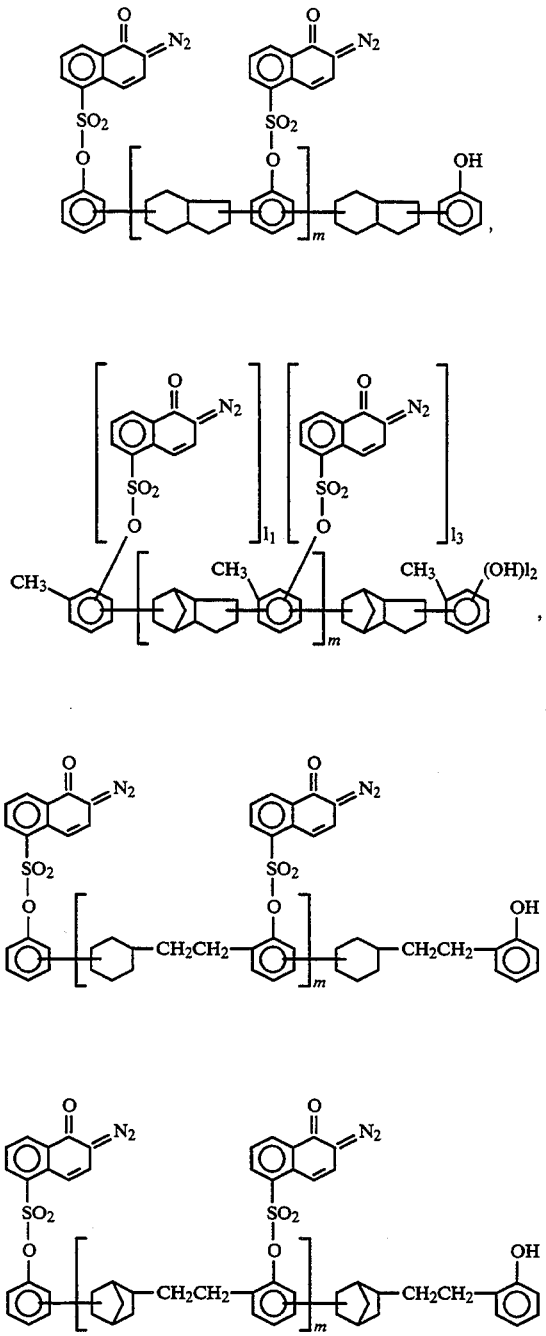

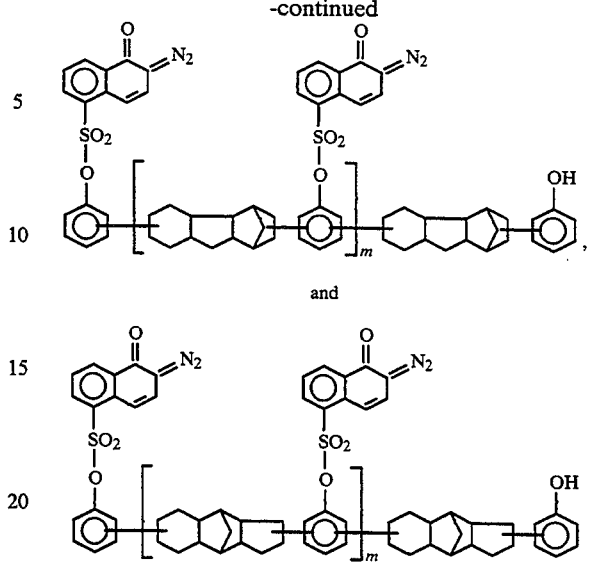

wherein m is from 0 to 10, and $l_1$, $l_2$ and $l_3$ are the same or different and each represents a number from 1 to 3; and (b) 100 parts by weight of an alkali-soluble resin.

2. The positive type photosensitive resin composition as claimed in claim 1 wherein said alkali-soluble resin (b) is selected from the group consisting of a resin having a phenolic hydroxyl group, a resin having a carboxyl group and mixtures thereof.

3. The positive type photosensitive resin composition as claimed in claim 2 wherein said resin having the phenolic hydroxyl group is selected from the group consisting of a novolak phenol resin, a bisphenol A phenol resin, polyvinyl phenol resin and mixtures thereof.

4. The positive type photosensitive resin composition as claimed in claim 2 wherein the resin having said carboxyl group is selected from the group consisting of a (meth)acrylic resin obtained by copolymerizing (meth)acrylic acid with a monomer having an ethylenic unsaturated bond; a maleic acid copolymer obtained by copolymerizing a compound selected from the group consisting of maleic acid, maleic anhydride, fumaric acid and mixtures thereof with a monomer having an ethylenic unsaturated bond; maleinated polybutadiene; and mixtures thereof.

5. The positive type photosensitive resin composition as claimed in claim 1 wherein a number average molecular weight of said alkali-soluble resin (b) is 500 to 10000.

6. The positive type photosensitive resin composition as claimed in claim 1 wherein an acid value of said alkali-soluble resin (b) is 40 to 250 mg KOH/g.

* * * * *